United States Patent
Tom et al.

(10) Patent No.: US 8,225,262 B1
(45) Date of Patent: Jul. 17, 2012

(54) METHOD OF AND SYSTEM FOR PLACING CLOCK CIRCUITS IN AN INTEGRATED CIRCUIT

(75) Inventors: Marvin Tom, Mountain View, CA (US); Wei Mark Fang, Campbell, CA (US); Srinivasan Dasasathyan, Sunnyvale, CA (US)

(73) Assignee: Xilinx, Inc., San Jose, CA (US)

( * ) Notice: Subject to any disclaimer, the term of this patent is extended or adjusted under 35 U.S.C. 154(b) by 330 days.

(21) Appl. No.: 12/406,883

(22) Filed: Mar. 18, 2009

(51) Int. Cl.
*G06F 17/50* (2006.01)

(52) U.S. Cl. ......... 716/122; 716/114; 716/129; 716/130

(58) Field of Classification Search .................. 716/114, 716/122, 129, 130
See application file for complete search history.

(56) References Cited

U.S. PATENT DOCUMENTS

| | | | | |
|---|---|---|---|---|
| 5,410,491 A * | 4/1995 | Minami | ........................ | 716/114 |
| 6,467,074 B1 * | 10/2002 | Katsioulas et al. | ........... | 257/207 |
| 6,751,786 B2 * | 6/2004 | Teng et al. | .................... | 716/114 |
| 6,981,233 B2 * | 12/2005 | Chang | ........................... | 716/113 |
| 7,032,198 B2 * | 4/2006 | Sano et al. | .................... | 716/104 |
| 7,117,143 B2 * | 10/2006 | Wang et al. | ..................... | 703/25 |
| 7,127,695 B2 * | 10/2006 | Huang et al. | ................... | 716/103 |
| 7,188,326 B2 * | 3/2007 | Yoshida | ......................... | 714/726 |
| 7,225,421 B2 * | 5/2007 | Migatz et al. | ................... | 716/114 |
| 7,334,210 B2 * | 2/2008 | Matsumura et al. | ........... | 257/207 |
| 7,353,485 B1 * | 4/2008 | Kannan et al. | .................. | 716/121 |
| 7,543,258 B2 * | 6/2009 | Kitahara et al. | ............... | 716/113 |
| 7,624,366 B2 * | 11/2009 | Alpert et al. | ................... | 716/119 |
| 7,669,160 B2 * | 2/2010 | Furnish et al. | ................. | 716/119 |
| 7,752,588 B2 * | 7/2010 | Bose | ............................... | 716/122 |
| 7,814,451 B2 * | 10/2010 | Furnish et al. | ................. | 716/100 |
| 7,840,919 B1 * | 11/2010 | Wang et al. | ..................... | 716/132 |
| 7,921,392 B2 * | 4/2011 | Furnish et al. | ................. | 716/110 |
| 7,921,393 B2 * | 4/2011 | Furnish et al. | ................. | 716/110 |
| 7,992,112 B2 * | 8/2011 | Morishita | ...................... | 716/104 |
| 8,010,926 B2 * | 8/2011 | Alpert et al. | ................... | 716/120 |
| 8,069,429 B2 * | 11/2011 | Miller et al. | ................... | 716/122 |
| 8,091,060 B1 * | 1/2012 | Tom et al. | ....................... | 716/121 |
| 8,108,812 B1 * | 1/2012 | van Antwerpen et al. | .... | 716/104 |
| 2003/0023938 A1 * | 1/2003 | Nagasaka et al. | ................. | 716/2 |
| 2004/0015803 A1 * | 1/2004 | Huang et al. | ..................... | 716/10 |
| 2004/0107408 A1 * | 6/2004 | Sano et al. | ......................... | 716/2 |
| 2006/0190899 A1 * | 8/2006 | Migatz et al. | .................... | 716/13 |
| 2006/0253821 A1 * | 11/2006 | Kitahara et al. | ................... | 716/6 |
| 2007/0094627 A1 * | 4/2007 | Komoda | .......................... | 716/10 |
| 2007/0150846 A1 * | 6/2007 | Furnish et al. | ..................... | 716/8 |
| 2007/0204252 A1 * | 8/2007 | Furnish et al. | ................... | 716/10 |
| 2008/0109777 A1 * | 5/2008 | Morishita | .......................... | 716/6 |
| 2008/0141202 A1 * | 6/2008 | Matsumura et al. | .............. | 716/8 |

(Continued)

OTHER PUBLICATIONS

ISE 10.1 In-Depth Tutorial, 168 pages, May 30, 2008, available at www.xilinx.com, Xilinx, Inc. 2100 Logic Drive, San Jose, CA.

*Primary Examiner* — Phallaka Kik
(74) *Attorney, Agent, or Firm* — John J. King

(57) ABSTRACT

A method of placing clock circuits in an integrated circuit is disclosed. The method comprises receiving a circuit design to be implemented in the integrated circuit; identifying portions of the circuit design comprising clock circuits; determining an order of clock circuits to be placed based upon resource requirements of the clock circuits; and placing the portions of the circuit design comprising clock circuits in sites of the integrated circuit. A system for placing clock circuits in an integrated circuit is also disclosed.

20 Claims, 7 Drawing Sheets

U.S. PATENT DOCUMENTS

| | | | |
|---|---|---|---|
| 2008/0216025 A1* | 9/2008 | Furnish et al. | 716/2 |
| 2008/0216038 A1* | 9/2008 | Bose | 716/8 |
| 2008/0216039 A1* | 9/2008 | Furnish et al. | 716/9 |
| 2008/0216040 A1* | 9/2008 | Furnish et al. | 716/10 |
| 2008/0222588 A1* | 9/2008 | Nonaka et al. | 716/10 |
| 2009/0178014 A1* | 7/2009 | Fredrickson et al. | 716/2 |
| 2009/0193376 A1* | 7/2009 | Alpert et al. | 716/9 |
| 2009/0254874 A1* | 10/2009 | Bose | 716/6 |

\* cited by examiner

METHOD OF AND SYSTEM FOR PLACING CLOCK CIRCUITS IN AN INTEGRATED CIRCUIT

FIELD OF THE INVENTION

The present invention relates generally to integrated circuits, and in particular, to a method of and system for placing clock circuits in an integrated circuit.

BACKGROUND OF THE INVENTION

Integrated circuits comprise a variety of circuit elements which are used to implement a circuit design. The circuit design must be laid out or "placed" according to the types and available locations of the circuit elements of an integrated circuit. The components of the circuit design must be assigned or placed in sites of the integrated circuit. In placing components of the circuit design, various factors are considered in deciding on the placement, and there are often competing interests and tradeoffs to achieve an optimal solution.

Components of a circuit design may be initially placed, and then randomly reconfigured using a process such as simulated annealing. However, the use of simulated annealing has several drawbacks. For example, an annealer uses thousands of random swaps to find a valid solution, often resulting in long run times for the placement. An annealer may also fail to converge to a solution even when a solution exists. Because of the random swapping, it may be possible that the optimal swaps may not be performed. Further, an annealer also uses random swaps which are dependent on the compiler. Each time a new placement is created, the specific swap instances are varied, leading to different results. Such variations in the results make debugging of the placement of a circuit design difficult.

SUMMARY OF THE INVENTION

A method of placing clock circuits in an integrated circuit is disclosed. The method comprises receiving a circuit design to be implemented in the integrated circuit; identifying portions of the circuit design comprising clock circuits; determining an order of clock circuits to be placed based upon resource requirements of the clock circuits; and placing the portions of the circuit design comprising clock circuits in sites of the integrated circuit. Determining an order of clock circuits to be placed may comprise identifying clock circuits having a component which is locked to a predetermined site, and/or determining an order based upon a number of components for each clock circuit. Placing the portions of the circuit design may comprise implementing a branch and bound placement algorithm, and may comprise selecting the locations of sites for implementing the components of clock circuits of the circuit design. The method may further comprise determining whether a placement restriction has been met after placing a component of a clock circuit and placing the remaining portion of the circuit design.

A computer program product is also disclosed. The computer program product comprises a computer-readable medium having computer-readable program code that, when executed by a computer, places clock circuits of a circuit design in sites of the integrated circuit, the computer-readable medium comprising computer-readable program code that receives a circuit design to be implemented in the integrated circuit; computer-readable program code that identifies portions of the circuit design comprising clock circuit; computer-readable program code that determines an order of clock circuits to be placed based upon resource requirements of the clock circuits; and computer-readable program code that places the portions of the circuit design comprising clock circuits in sites of the integrated circuit. The computer-readable program code that determines an order of clock circuits to be placed may comprise computer-readable program code that identifies clock circuits having a component which is locked to a predetermined site. The computer-readable program code that determines an order of clock circuits to be placed may comprise computer-readable program code that determines an order based upon a number of components for each clock circuit. The computer-readable program code that places the portions of the circuit design may comprise computer-readable program code that implements a branch and bound placement algorithm. The computer-readable program code that places the portions of the circuit design may comprise computer-readable program code that selects the locations of sites for implementing components of clock circuits of the circuit design. The computer program product may further comprise computer-readable program code that determines whether a placement restriction has been met after placing a component of a clock circuit. The computer program product may further comprise computer-readable program code that places the remaining portion of the circuit design.

A system for placing clock circuits in an integrated circuit is also disclosed. The system comprises an input data that includes a circuit design to be implemented in the integrated circuit; a control circuit coupled to receive the input data, the control circuit placing clock circuits of a circuit design in sites of the integrated circuit, wherein the control circuit identifies portions of the circuit design comprising clock circuits and determines an order of the clock circuits to be placed based upon resource requirements of the clock circuits; and a placement information, output by the control circuit, to provide information regarding a placement of the clock circuits. The control circuit may determine an order of clock circuits to be placed by identifying clock circuits having a component which is locked to a predetermined site. The control circuit may determine an order of the clock circuits to be placed by determining an order based upon a number of components for each clock circuit. The control circuit may place the clock circuits by selecting the locations of sites for implementing the clock circuits of the circuit design. The control circuit may determine whether a placement restriction has been met after placing components of the clock circuit. The control circuit may place the remaining portion of the circuit design.

DETAILED DESCRIPTION OF THE DRAWINGS

Figure 1:
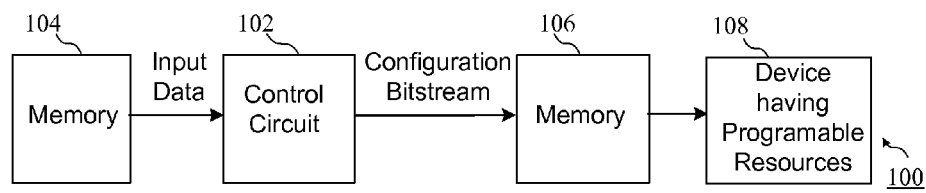
FIG. 1 is a block diagram of a system for implementing a device having programmable logic according to an embodiment of the present invention.

Turning first to FIG. 1, a block diagram of a system 100 for implementing a device having programmable resources according to an embodiment the present invention is shown. In particular, a control circuit 102 is coupled to receive input data from a memory 104, and generate a configuration bitstream which is stored in a memory 106. As will be described in more detail below, the input data may comprise a circuit design defined in a high definition language (HDL) such as VHDL, for example. The control circuit may comprise a computer running software which generates a configuration bitstream which is stored in a memory 106. The configuration bitstream comprises a placement configuration which provides information related to the placement of components, such as components of clock circuits of a circuit design implemented in the device. Memory 106 comprises a non-volatile memory for storing the configuration bitstream for loading it into an integrated circuit device having programmable resources 108. The programmable resources may be programmable logic as described in more detail below, or other programmable elements of an integrated circuit. As will be described in more detail below, the control circuit 102 generates a configuration bitstream having an optimized placement of clock components.

While the methods of the present invention may be applied to the placement of clock circuits in any type of integrated circuit, the methods find particular application to devices having programmable logic, and are described in reference to devices having programmable logic in detail below. The software flow for the design of a device having programmable resources comprises synthesis, packing, placement and routing, as is well known in the art. Synthesis comprises the step of converting a circuit design in a high level language to a configuration of elements found in the device having programmable logic. For example, portions of a circuit design implementing certain functions may be implemented in configurable logic blocks (CLBs), as will be described in more detail below. Packing comprises the step of grouping portions of the circuit design into defined blocks of the device, such as configurable logic blocks. Placing comprises the step of determining the location of the blocks of the device defined during the packing step, wherein the blocks in a design are placed on the two-dimensional grid associated with sites associated with the device. Placement is performed by a placer, which may comprise placement software running on a computer, or a portion of a larger software package running on a computer for implementing the circuit design in the device. Finally, routing comprises selecting paths of interconnect elements, such as programmable interconnects in a device having programmable logic. Devices having programmable logic typically comprise a number of types of circuit blocks which enable the implementation of clock circuits. As will be described in more detail below, the number of each type of circuit blocks is typically a fixed predetermined number for a given device, and these circuit blocks may have placement restrictions regarding the combination of blocks and the connections between circuit blocks to form circuits such as a clock circuit.

Placement is an important phase of the design flow. When describing placement, the term "site" is used to represent a hardware unit at a particular location on a device such as an FPGA, and the term "component" is used to represent a component in the circuit design to be implemented on the device. The term "placer" is used to represent a software tool to conduct the placement task. The term "clock placer" is used to represent a phase of the placer which places the clock related components. The clock placer may be implemented in software running on a computer, and must obey all the clock placement rules imposed by the device architecture. The goal of the clock placer is to find a feasible placement of the clock components where all the clock placement rules of the architecture are met. Benchmark testing on more than one thousand designs shows that one or more embodiments of the present invention lead to improved run times on 98% of the designs compared to the designs placed using a conventional annealer algorithm.

Figure 2:
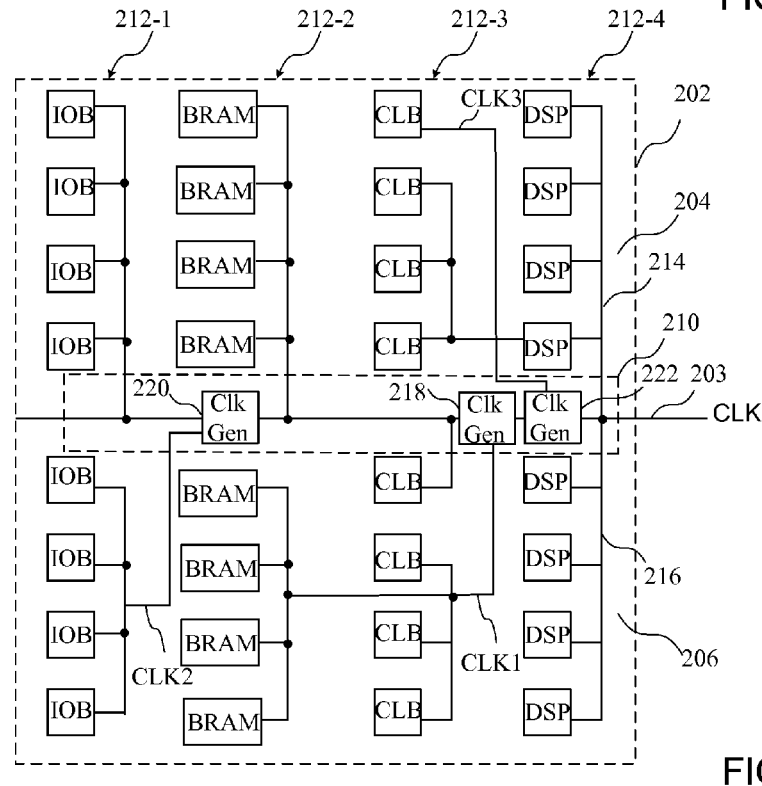
FIG. 2 is a block diagram of a device having a variety of logic blocks and a clock tree according to an embodiment of the present invention.

Turning now to FIG. 2, a block diagram of a device having a variety of logic blocks and a clock tree according to an embodiment of the present invention is shown. A region 202 of a device having programmable logic comprises a clock tree which routes clock signals. As shown, a clock signal (CLK) first enters the region on one side and travels along a horizontal clock row 203. An upper portion 204 of the device above the horizontal clock row and a lower portion 206 of the device below the horizontal clock row receives clock signals from the horizontal clock row 203 or clock generators in a center row 210. A plurality of columns, shown here as columns 212-1 through 212-4, comprise blocks of programmable logic. In particular, column 212-1 comprises input/output blocks (IOBs), column 212-2 comprises blocks of random access memory (BRAMs), column 212-3 comprises configurable logic blocks (CLBs), and column 212-4 comprises digital signal processor (DSP) blocks. Clock signals are routed to the various blocks by vertical clock trees, such as a clock tree 214 extending upward from the horizontal clock row 203, or a clock tree 216 extending downward from the horizontal clock row 203. The circuit of FIG. 2 may comprise many more columns of blocks and may have different types of blocks, as will be described below in more detail in reference to the circuit of FIG. 9.

A sub-set of the logic blocks are related to clock synthesis and clock modification. Clock synthesis is the process of creating a clock signal at a specific frequency and duty cycle. Clock modification is the process of modifying the clock frequency or duty cycle of an existing clock or phase aligning a clock relative to another clock. As shown in FIG. 2, a first clock generator 218 generates a first clock signal (CLK1) coupled to a group of CLBs and BRAMS in the lower portion 206. A second clock generator 220 generates a second clock signal (CLK2) which is coupled to a group of IOBs in the lower portion 206. A third clock generator 222 generates a third clock signal (CLK3) which is coupled to a CLB in the upper portion 204. The remaining logic blocks are coupled to receive the CLK signal.

Because clock signals operate at high frequency, clock components used to implement the clock generators 218-222 must be placed relatively close to each other to minimize delay. For example, a clock source driving a clock component for modifying a clock signal (e.g., an IOB driving a Phase Locked Loop (PLL)) must be placed adjacent to each other because there are dedicated connections between the clock source and the PLL. Each FPGA architecture typically has strict clock placement rules for components of clock circuits. The goal of the clock placer is to find a legal placement for all components of the clock circuit while satisfying these strict clock placement rules. While programmable logic blocks are shown by way of example in FIG. 2, other programmable resources can be implemented in the various blocks of FIG. 2.

Figure 3:
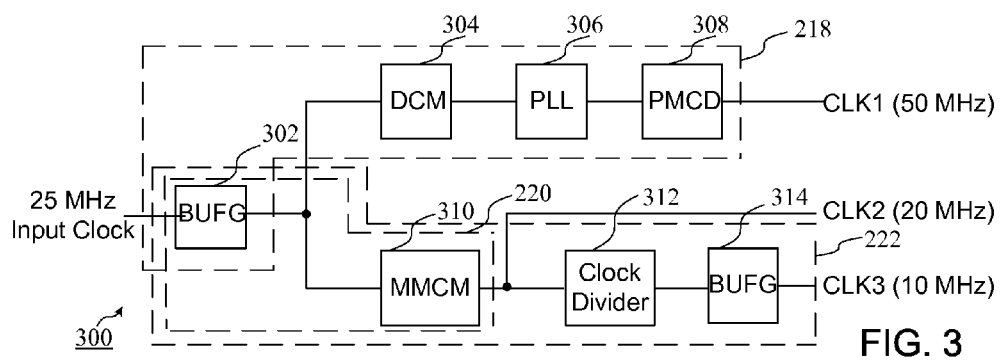
FIG. 3 is a block diagram of a circuit for generating a plurality of clock signals according to an embodiment of the present invention.

Turning now to FIG. 3, a block diagram of a circuit for generating a plurality of clock signals according to an embodiment of the present invention is shown. The circuit of FIG. 3 comprises a plurality of clock circuits. Each clock circuit may comprise one or more of a variety of clock components, such as a Clock Buffer (BUFG), a Digital Clock Manager (DCM), a PLL, Clock I/Os, Gigabit Transceivers (GT), GT input buffers (BUFDS), dedicated IO for GTs (IPAD/OPAD), a form of combined DCM/PLL (MMCM), a clock buffer for IO clocks (BUFIO), phase-matched clock driver (PMCDs), regional clock buffers (BUFR), and a clock divider, all of which are known in the art. In particular, a circuit 300 for generating a plurality of clock signals comprises a BUFG 302 coupled to receive an input clock signal, shown here by way of example as a 25 MHz input clock signal. The first clock generator 218 comprises a clock circuit coupled to a plurality of clock components, including the BUFG 302 and a DCM 304 coupled to a PLL circuit 306 and a PMCD circuit 308. The first clock generator 218 generates a 50 MHz clock signal as CLK1. The second clock generator 220 comprises an MMCM 310 coupled to the BUFG 302 to generate 20 MHz clock signal as CLK2. Finally, a third clock generator 222 comprises the MMCM 310 coupled to the BUFG 302 which generates the 20 MHz signal, and a clock divider 312 and a BUFG 314 coupled to the MMCM 310 to generate a 10 MHz signal. While the clock circuits of FIG. 3 are shown by way of example, it should be understood that many other arrangements of clock components may be combined to form other clock circuits. Further, while the clock circuits are shown as clock synthesis circuits in FIG. 3, the clock circuits may comprise clock modification circuits, and may be as simple as a delay element for generating a delayed clock signal.

Figure 4:
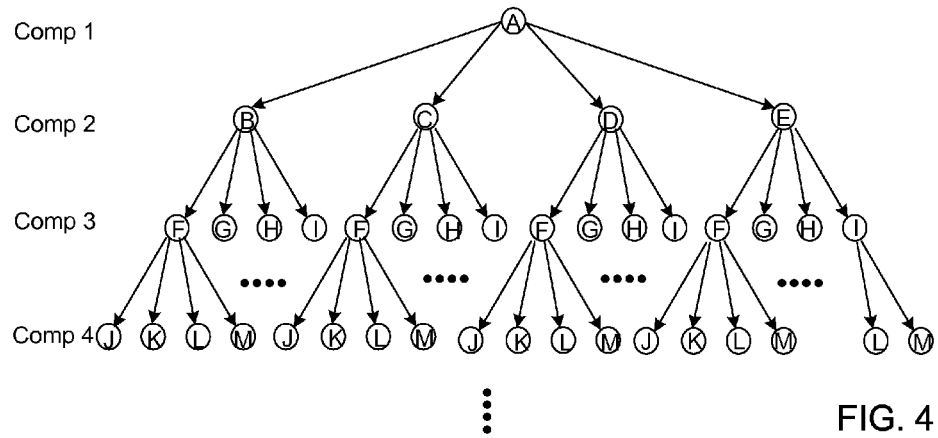
FIG. 4 is a tree diagram associated with a method of placing four components of a clock circuit according to an embodiment of the present invention.

Turning now to FIG. 4, a tree diagram associated with a method of placing four components of a clock circuit according to an embodiment of the present invention is shown. In particular, the tree diagram of FIG. 4 shows a method for placing Component 1 through Component 4 of a clock circuit. According to one aspect of the invention, clock components of a circuit design to be mapped to an FPGA are placed using a branch and bound search technique. A branch and bound search algorithm is a known algorithm for finding solutions for optimization problems. It consists of systematic enumeration of all candidate solutions, where large subsets of candidates are discarded by using upper or lower bounds. A general branch and bound technique can be used to find the minimum or maximum value of a function f(x), where x represents the solution of the optimization problem. The branch and bound technique used in the methods of the present invention is further simplified because the goal of the branch and bound search is to find a zero cost solution. That is, all non-zero candidate branches in the branch and bound search tree are automatically pruned from the search space rather than evaluating the function f(x) in each search iteration.

Each "row" of the tree of FIG. 4 may be labeled as a clock component to be placed. Each leaf node in that row represents a specific site where a component may be placed. In this example, after selecting an available node for placing Component 1, if the search gets to a node 2 to place the Component 2 and a non-zero solution is found, the search algorithm then backtracks and goes to node 3. That is, there is no benefit in continuing down the leaf nodes of node 2 when it is already known to have a non-zero partial solution. The search continues until a node is found that has no more leaf nodes. For example, the final solution may consist of Components 1-4 being placed in nodes A, E, F and K.

The placement of the circuit components by a clock placer to generate CLK1 of FIG. 3 is described by way of example. Each component is given a unique name (e.g. Component 1, Component 2, etc.). Each component of the clock circuit is a certain type of component as shown in FIG. 3 and also has a list of its placeable sites. For example, Component 1 may be a component type BUFG which may be placed in Site (A), Component 2 may be a component type DCM which may be placed in Sites (B,C,D,E), Component 3 may be a component type PLL and may be placed in Sites (F,G,H,I), and Component 4 may be a component type PMCD and may be placed in Sites (J,K,L,M).

In placing the circuit components necessary to generate CLK1, a legal placement is found once every component is assigned to a site. The search process starts at the top of the search tree. In this case, Component 1 is placed on site A. To determine whether a node has a zero cost, two checks are made. A "CanPlace" check is initially performed, which determines whether the types are matching. For example, a placer cannot place an I/O component on a PLL site. The placer then determines whether the site falls within any placement restriction. One type of placement restriction is an "area group constraint" given by the user. For example, a user constraint may restrict the placement of a second component of the clock circuit to a portion of the device, such as the top half of the device where the first component is placed, thereby reducing the distance between the devices. Another type of placement restriction includes clock placement rules, which typically involve the relative placement of components related to a given component of a clock circuit.

However, in considering placement restrictions, only a partial placement may exist at each node evaluation. For example, a clock placement rule may require that a DCM and a PLL must be placed adjacent to each other (e.g. a Component 2 and a Component 3 of a clock circuit). However, the PLL will not have been placed while evaluating candidate sites for the DCM. In this case, the existence of an unplaced component (i.e., Component 3) in a clock rule will automatically cause the rule to evaluate to TRUE. If either of the two checks evaluate to FALSE, the search down the leaf nodes for that node are immediately eliminated from the search space.

In placing clock circuit 218, the algorithm initially attempts to place Component 2 (i.e., DCM 304) in site B. If the node is occupied or a placement rule is violated, the search algorithm does not proceed down the leaf nodes of site B. Instead, the search proceeds to place Component 2 on site C. If the search algorithm finds a node with no more leaf nodes, then a legal solution can be found. In this case, the legal solution may comprise Comp 1 placed on Site A, Comp 2 placed on Site E, Comp 3 placed on Site F, and Comp 4 placed on Site K. It should be noted that the arrangement of the tree and the TRUE and FALSE determinations down the branches of the tree depend upon the number of each type of clock component and the various placement restrictions associated with clock components of the device. For example, a device may have 20 clock I/Os and 32 BUFGs. However, the I/Os are located in certain areas, and only certain I/Os may be coupled to certain BUFGs. While this search method is very similar to a "depth first" search which is a well known graph traversal algorithm, the main difference in this graph traversal is that large portions of the search space are automatically pruned according to an embodiment of the present invention.

According to one aspect of the present invention, the ordering of the placement of clock circuits is considered to reduce the time required to place the circuits and to lead to more efficient placements. As will be described in more detail below, the ordering of clock circuits to be placed has a significant impact on the run time of the algorithm. For example, if the ordering of the sites for Component 2 were slightly modified, the search space would be considerably sped up. In the example below, sites B and E may be swapped in the search space. In this new ordering, a legal solution may be found in 5 node visits (i.e., sites A, B, F, and K) as opposed to the 12 node visits (i.e., sites A, E, F, and K) in the original example. An example of ordering the clock circuits to improve run time for placement is described below in reference to FIGS. 5 and 6.

Figure 5:
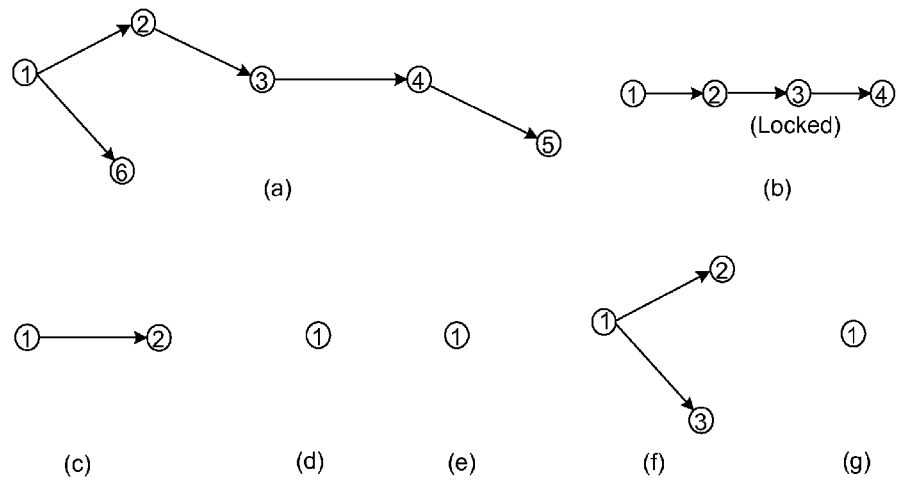
FIG. 5 is a series of figures showing components of clock circuits according to an embodiment of the present invention.

According to an embodiment of the present invention, the first step in component ordering is to create a clock placer graph. The clock placer graph is a directed acyclic graph where each node represents a clock component to be placed and each edge represents a wire connecting two clock components, where the wires not subject to any clock placement rules are excluded from the graph. As shown in the example of FIG. 5, there are 7 groups of independently connected components in the clock placer graph. The component ordering heuristic is split up into two tasks. The first task is to order the groups of components. Using the results of group ordering, the second task will perform detailed ordering of the components.

Figure 6:
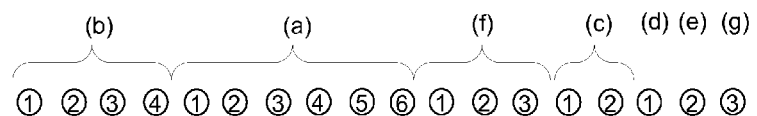
FIG. 6 is a figure showing an order of placing clock circuits according to an embodiment of the present invention.

The results of the ordering heuristic on the groups set forth in FIG. 5 results in the following component order shown in FIG. 6. The rationale behind the component ordering is that the groups which are the hardest to place should be placed first. Because the easier groups have much more freedom to be placed anywhere, those groups are placed last. In general, the groups with locked components are the hardest groups to place. Accordingly, the groups with locked components are placed at the front of the list. The remaining groups are placed according to the size of the group (i.e., total number of components). Groups with a large number of components generally have very limited solutions and thus are placed at the front of the list behind groups with locked components. However, it should be understood that other criteria may be employed for placing the groups in a certain order. It should be noted that the number for each group is started with a Component 1, where the Component 1 is placed in a site which is available and not in violation of any placement restrictions, and the remaining components are then placed.

Figure 7:
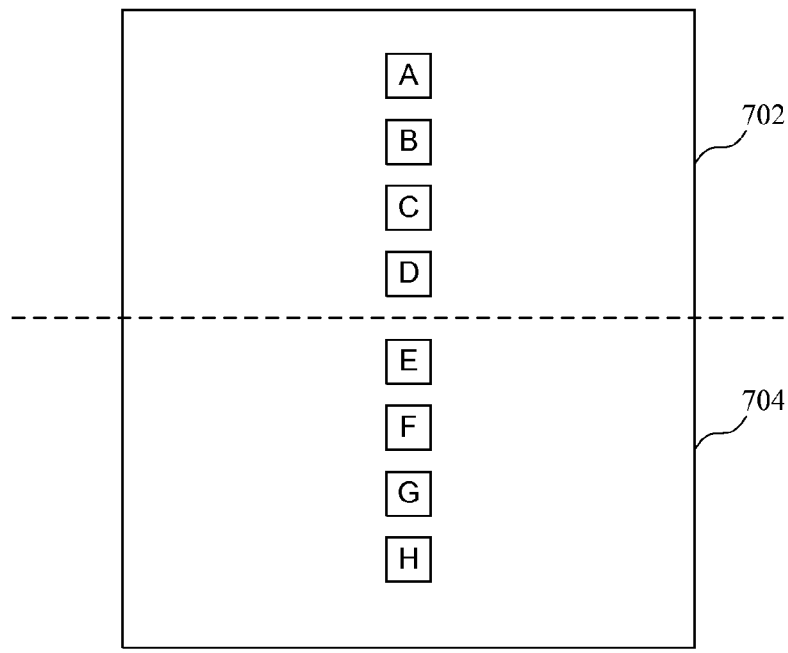
FIG. 7 is a block diagram of a layout of sites for placing clock circuits according to an embodiment of the present invention.

Turning now to FIG. 7, a block diagram of a layout of sites for placing clock circuits according to an embodiment of the present invention is shown. Site ordering is preferably performed based on the natural symmetry of a device receiving the components. Once the component ordering is chosen, a specific site is then also chosen for each component according to a site ordering. A different site ordering is used for a Virtex® FPGA device and Spartan® FPGA device, for example, both of which are available from Xilinx, Inc. of San Jose, Calif. Because the clocking structure in a Virtex® device is coarsely divided into two regions, clock sites on the top half of the device and clock sites on the bottom half have similar clock placement restriction. Therefore, components are placed in alternate sites between the top half and bottom half of the device, subject to any placement rules. For example, a first component may be placed at site A in the top portion 702 of the device, and then the next component would be placed at site E in the bottom portion 704. However, the placement at site E may be rejected and an alternative placement at site B may be selected if a placement restriction is violated. Such a placement restriction may be violated if the second component is a part of the same clock circuit as the first component, and the placement of the second component in the lower region would place the second component too far from the first component. While a similar technique is used for Spartan® FPGAs, the main difference is that the clocking structure of the Spartan® device is divided into quadrants 802-808. After components are placed in sites on the top portion (i.e., A, B, C, and D) and the bottom portion (i.e., I, J, K, and L), components are placed in the left and right sides, alternating between the left and right sides.

Figure 8:
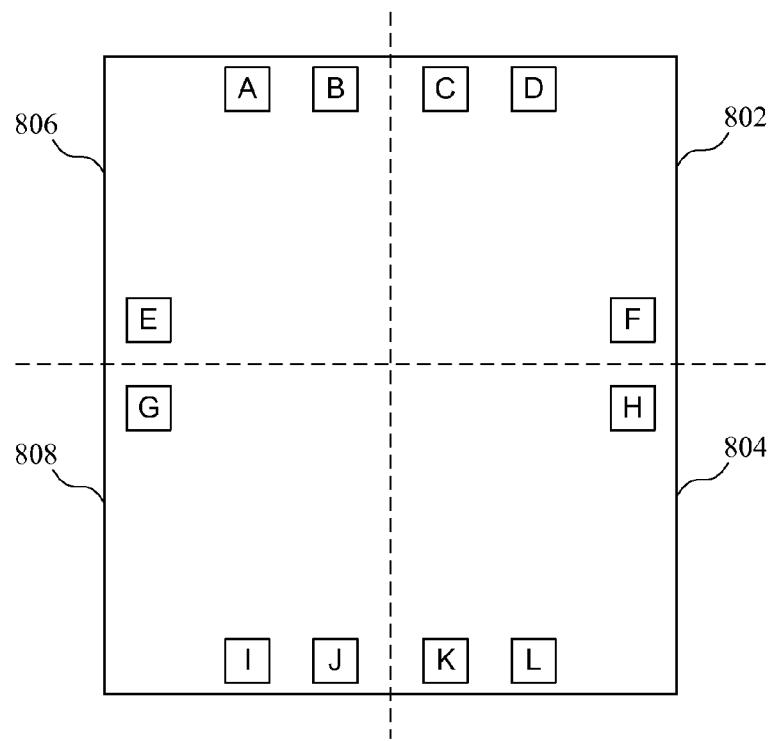
FIG. 8 is a block diagram of a layout of sites for placing clock circuits according to an alternate embodiment of the present invention.
Figure 9:
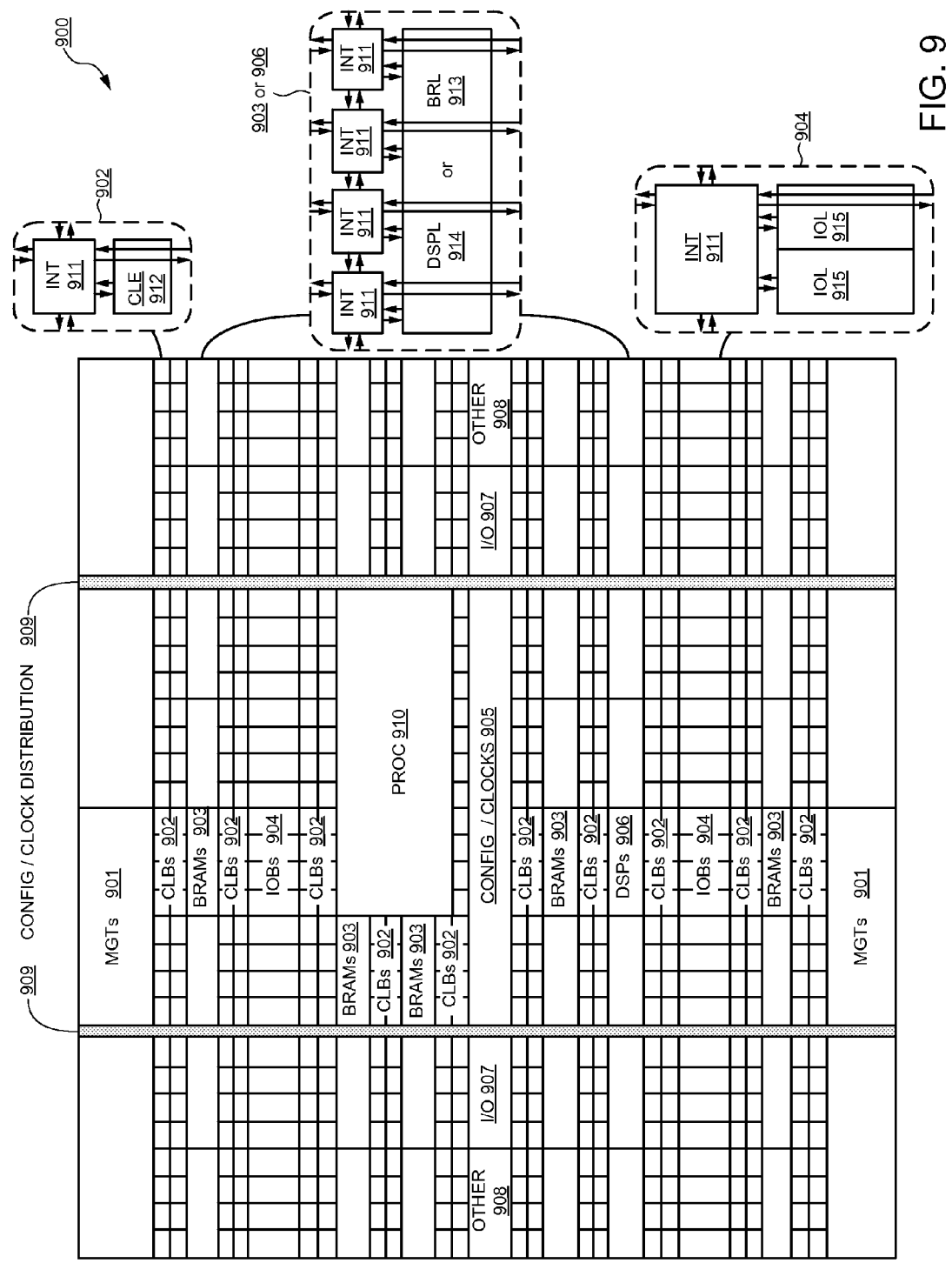
FIG. 9 is a block diagram of a device having programmable logic according to an embodiment of the present invention.

Turning now to FIG. 9, a block diagram of a device having programmable logic according to an embodiment of the present invention is shown. The circuits and methods of the present invention as described above with respect to FIGS. 1-8 may be implemented in the circuit of FIG. 9. While devices having programmable logic may be implemented in any type of integrated circuit device, such as an application specific integrated circuit (ASIC) having programmable logic, other devices comprise dedicated programmable logic. A programmable logic device (PLD) is an integrated circuit device designed to be user-programmable so that users may implement logic designs of their choices. One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of CLBs is coupled to programmable IOBs. The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration bitstream comprises information related to the placement of blocks, and therefore comprises a placement configuration for the circuit implemented in a particular device. The configuration data bits may be stored in volatile memory (e.g., static memory cells, as in FPGAs and some CPLDs), in non-volatile memory (e.g., flash memory, as in some CPLDs), or in any other type of memory cell.

The device of FIG. 9 comprises an FPGA architecture 900 having a large number of different programmable tiles including multi-gigabit transceivers (MGTs) 901, CLBs 902, BRAMs 903, input/output blocks (IOBs) 904, configuration and clocking logic (CONFIG/CLOCKS) 905, digital signal processing blocks (DSPs) 906, specialized input/output blocks (I/O) 907 (e.g., configuration ports and clock ports), and other programmable logic 908 such as digital clock managers, analog-to-digital converters, system monitoring logic, and so forth. Some FPGAs also include dedicated processor blocks (PROC) 910.

In some FPGAs, each programmable tile includes a programmable interconnect element (INT) 911 having standardized connections to and from a corresponding interconnect element in each adjacent tile. Therefore, the programmable interconnect elements taken together implement the programmable interconnect structure for the illustrated FPGA. The programmable interconnect element 911 also includes the connections to and from the programmable logic element within the same tile, as shown by the examples included at the top of FIG. 9.

For example, a CLB 902 may include a configurable logic element (CLE) 912 that may be programmed to implement user logic plus a single programmable interconnect element 911. A BRAM 903 may include a BRAM logic element (BRL) 913 in addition to one or more programmable interconnect elements. The BRAM comprises dedicated memory separate from the distributed RAM of a configuration logic block. Typically, the number of interconnect elements included in a tile depends on the height of the tile. In the pictured embodiment, a BRAM tile has the same height as four CLBs, but other numbers (e.g., five) may also be used. A DSP tile 906 may include a DSP logic element (DSPL) 914 in addition to an appropriate number of programmable interconnect elements. An IOB 904 may include, for example, two instances of an input/output logic element (IOL) 915 in addition to one instance of the programmable interconnect element 911. The location of connections of the device is controlled by configuration data bits of a configuration bitstream provided to the device for that purpose. The programmable interconnects, in response to bits of a configuration bitstream, enable connections comprising interconnect lines to be used to couple the various signals to the circuits implemented in programmable logic, or other circuits such as BRAMs or the processor.

In the pictured embodiment, a columnar area near the center of the die is used for configuration, clock, and other control logic. Vertical areas 909 extending from this column are used to distribute the clocks and configuration signals across the breadth of the FPGA. Some FPGAs utilizing the architecture illustrated in FIG. 9 include additional logic blocks that disrupt the regular columnar structure making up a large part of the FPGA. The additional logic blocks may be programmable blocks and/or dedicated logic. For example, the processor block PROC 910 shown in FIG. 9 spans several columns of CLBs and BRAMs.

Note that FIG. 9 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 9 are purely exemplary. For example, in an actual FPGA more than one adjacent column of CLBs is typically included wherever the CLBs appear, to facilitate the efficient implementation of user logic.

Figure 10:
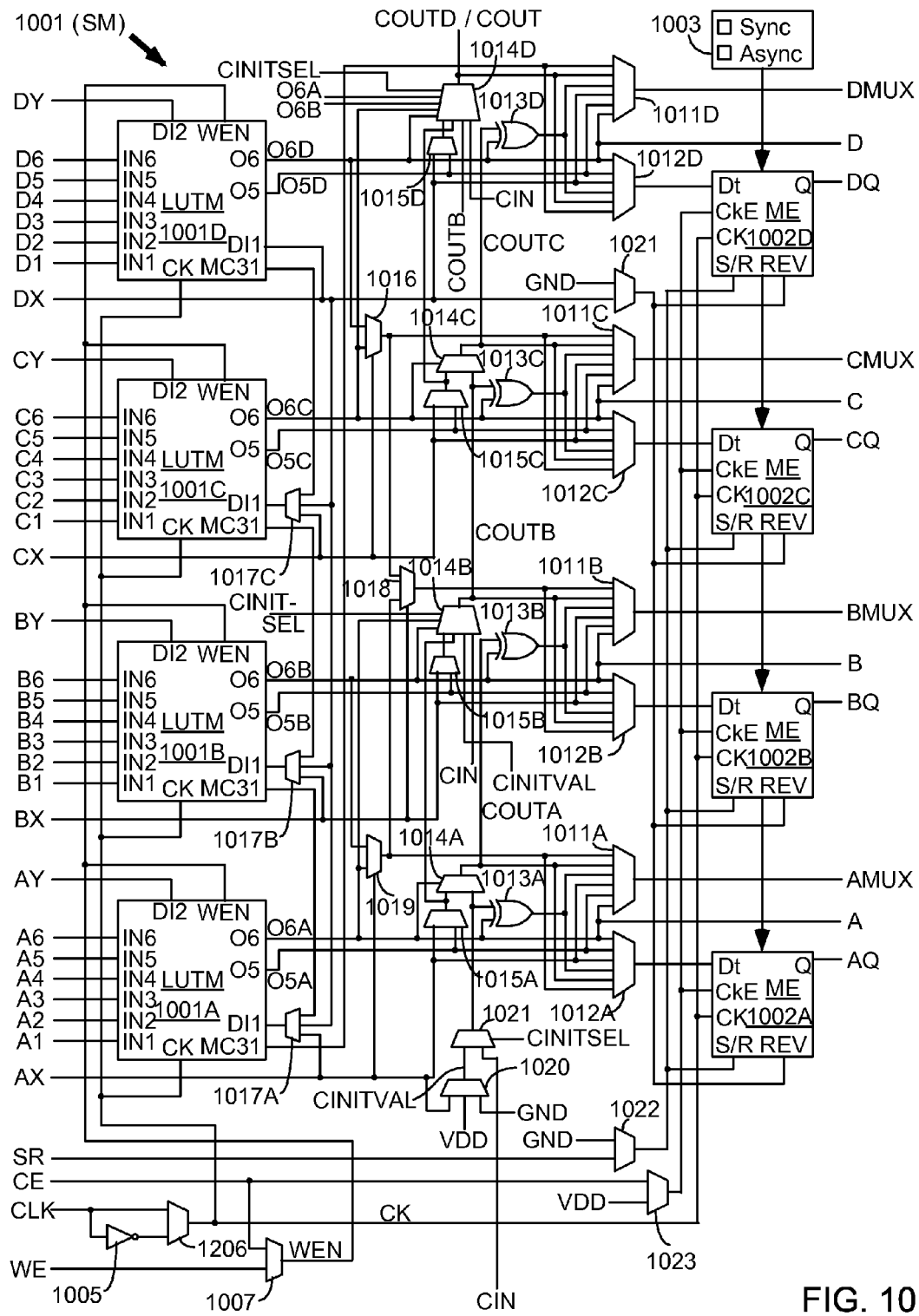
FIG. 10 is a block diagram of configurable logic element of the device of FIG. 9 according to an embodiment of the present invention.

Turning now to FIG. 10, a block diagram of a configurable logic element of the device of FIG. 9 according to an embodiment of the present invention is shown. In particular, FIG. 10 illustrates in simplified form a configurable logic element of a configuration logic block 902 of FIG. 9. In the embodiment of FIG. 10, slice M 1001 includes four lookup tables (LUTMs) 1001A-1001D, each driven by six LUT data input terminals A1-A6, B1-B6, C1-C6, and D1-D6 and each providing two LUT output signals O5 and O6. The O6 output terminals from LUTs 1001A-1001D drive slice output terminals A-D, respectively. The LUT data input signals are supplied by the FPGA interconnect structure via input multiplexers, which may be implemented by programmable interconnect element 1011, and the LUT output signals are also supplied to the interconnect structure. Slice M also includes: output select multiplexers 1011A-1011D driving output terminals AMUX-DMUX; multiplexers 1012A-1012D driving the data input terminals of memory elements 1002A-1002D; combinational multiplexers 1016, 1018, and 1019; bounce multiplexer circuits 1022-1023; a circuit represented by inverter 1005 and multiplexer 1006 (which together provide an optional inversion on the input clock path); and carry logic comprising multiplexers 1014A-1014D, 1015A-1015D, 1020-1021 and exclusive OR gates 1013A-1013D. All of these elements are coupled together as shown in FIG. 10. Where select inputs are not shown for the multiplexers illustrated in FIG. 10, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 10 for clarity, as well as from other selected figures herein.

In the pictured embodiment, each memory element 1002A-1002D may be programmed to function as a synchronous or asynchronous flip-flop or latch. The selection between synchronous and asynchronous functionality is made for all four memory elements in a slice by programming Sync/Asynch selection circuit 1003. When a memory element is programmed so that the S/R (set/reset) input signal provides a set function, the REV input terminal provides the reset function. When the memory element is programmed so that the S/R input signal provides a reset function, the REV input terminal provides the set function. Memory elements 1002A-1002D are clocked by a clock signal CK, which may be provided by a global clock network or by the interconnect structure, for example. Such programmable memory elements are well known in the art of FPGA design. Each memory element 1002A-1002D provides a registered output signal AQ-DQ to the interconnect structure. Because each LUT 1001A-1001D provides two output signals, O5 and O6, the LUT may be configured to function as two 5-input LUTs with five shared input signals (IN1-IN5), or as one 6-input LUT having input signals IN1-IN6.

In the embodiment of FIG. 10, each LUTM 1001A-1001D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 1017A-1017C for LUTs 1001A-1001C), or to the two 32-bit RAMs via input terminals DI1 and DI2. RAM write operations in the LUT RAMs are controlled by clock signal CK from multiplexer 1006 and by write enable signal WEN from multiplexer 1007, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 1001A may also be provided to the general interconnect structure for shift register chaining, via output select multiplexer 1011D and CLE output terminal DMUX.

Figure 11:
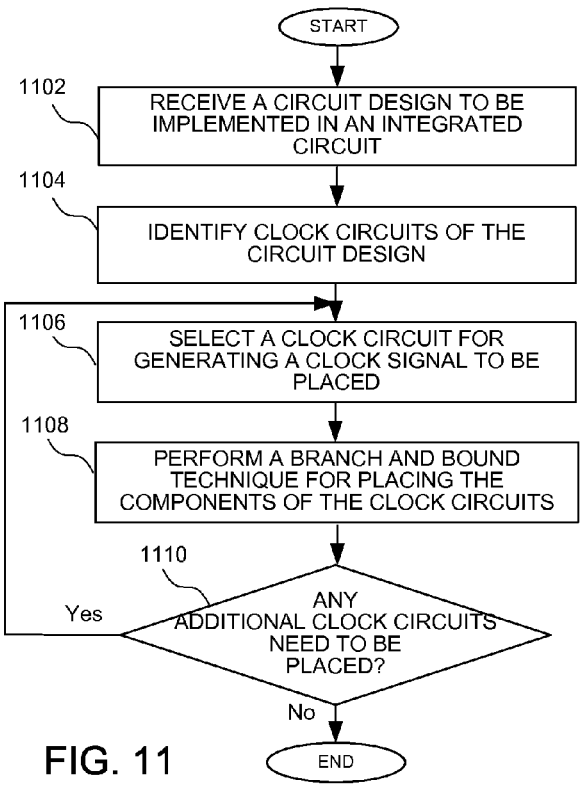
FIG. 11 is a flow chart showing a method of placing clock components of a circuit design according to an embodiment of the present invention.

Turning now to FIG. 11, a flow chart shows a method of placing clock components of a circuit design according to an embodiment of the present invention. The flow chart of FIG. 11 as well as the flow charts of FIGS. 12-14 may be implemented using the circuits of FIGS. 1-10 as described above, or other suitable circuits. According to the method of FIG. 11, a circuit design to be implemented in an integrated circuit is received at a step 1102. Clock circuits of the circuit design are identified at a step 1104, and a clock circuit for generating a clock signal to be placed is selected at a step 1106. A branch and bound technique for placing the components of the clocking circuit is performed at a step 1108. It is then determined whether any additional clock circuits need to be placed at a step 1110. If so, a next clock circuit is selected at step 1106.

Figure 12:
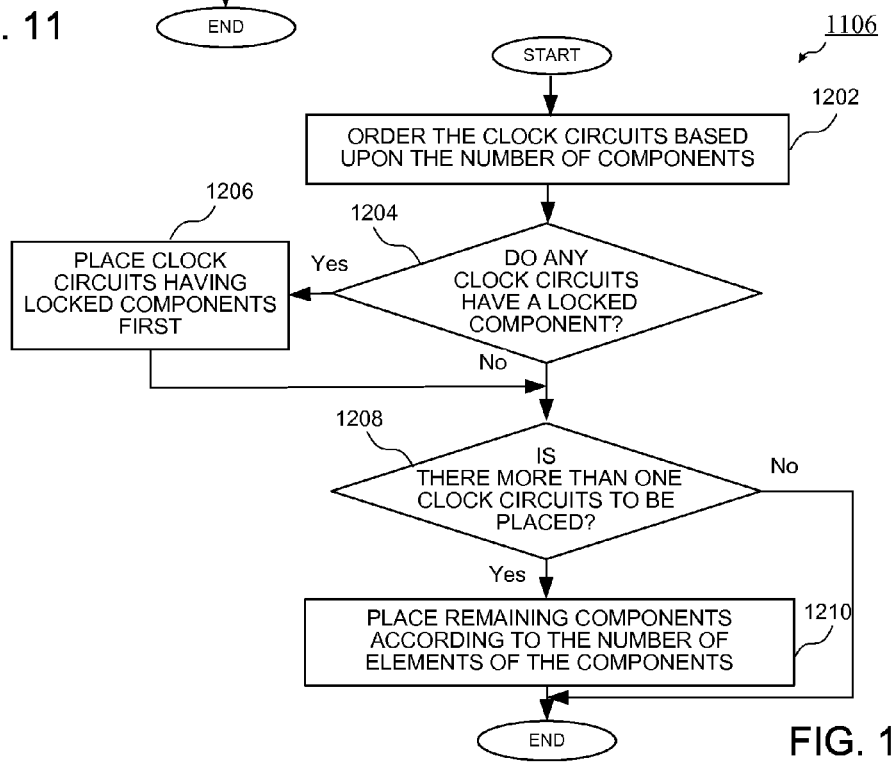
FIG. 12 is a flow chart showing a method of ordering clock circuits to be placed according to an embodiment of the present invention.

Turning now to FIG. 12, a flow chart shows a method of ordering clock circuits to be placed according to step 1106 of FIG. 11. The clock circuits are ordered based upon the number of components at a step 1202. It is then determined whether any clock circuits have a component locked to a particular site at a step 1204. If so, the clock circuits having locked components are placed first at a step 1206. If there is more than one clock circuit having a locked component, those circuit circuits are placed according to the number of components. It is then determined whether there are additional clock circuits to be placed at a step 1208. If so, the remaining clock circuits are placed according to the number of elements of the components at a step 1210.

Figure 13:
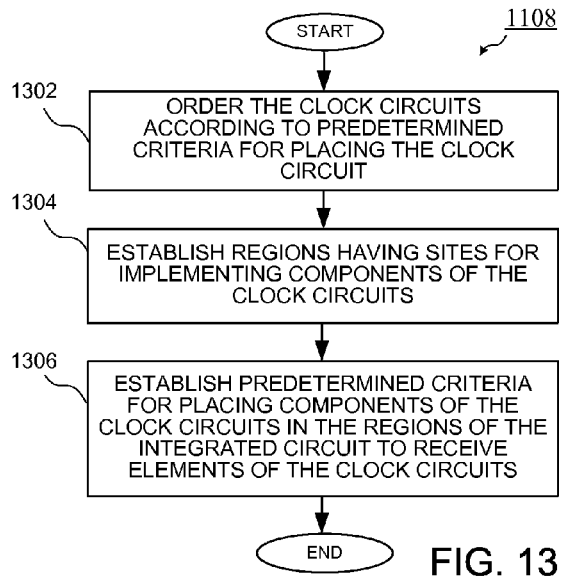
FIG. 13 is a flow chart showing a method of performing a branch and bound technique according to an embodiment of the present invention.

Turning now to FIG. 13, a flow chart shows a method of selecting a clock circuit to be placed according to step 1108 of FIG. 11. The clock circuits are ordered according to predetermined criteria for placing the clock circuit at a step 1302. Regions having sites for implementing components of the clock circuits are then established at a step 1304. For example, two regions may be established as shown in FIG. 7 or four regions may be established as shown in FIG. 8. Predetermined criteria for placing components of the clock circuits in the regions of the integrated circuit are also established at a step 1306. For example, components may be placed in alternate sites as set forth above with respect to FIGS. 7 and 8.

Figure 14:
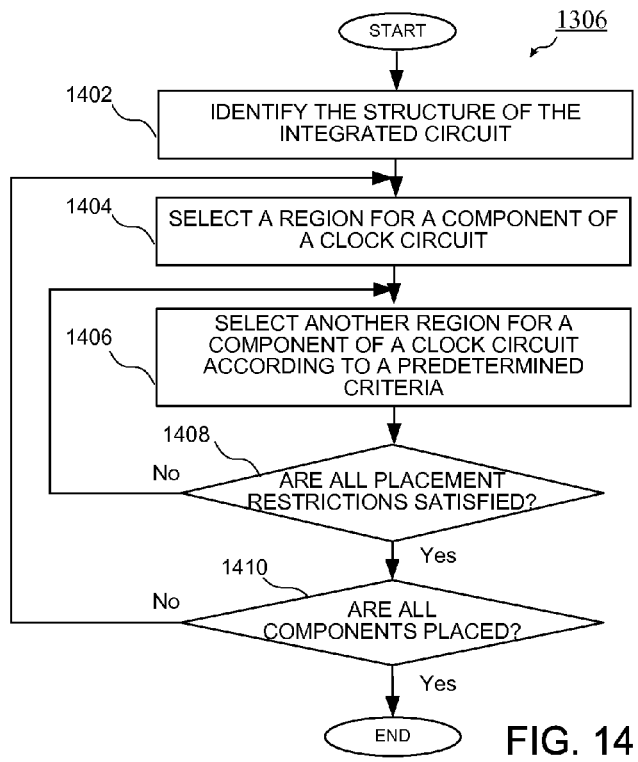
FIG. 14 is a flow chart showing a method of placing clock components in sites of an integrated circuit according to an embodiment of the present invention.

Turning now to FIG. 14, a flow chart shows a method of placing clock components in sites of an integrated circuit according to an embodiment of the present invention. The structure of the integrated circuit is identified at a step 1402. A region for a component of a clock circuit is selected at a step 1404. Another region for a second component of a clock circuit is selected at a step 1406. It is then determined whether all placement restrictions are satisfied at a step 1408. If not, another region is selected for the component. Finally, it is determined whether all components are placed at a step 1410. If not, the components continue to be placed according to the predetermined criteria. While various methods are shown separately in FIGS. 11-14, it should be understood that the various methods could be employed together.

It can therefore be appreciated that the new and novel and method of circuit for placing clock circuits in an integrated circuit has been described. It will be appreciated by those skilled in the art that numerous alternatives and equivalents will be seen to exist which incorporate the disclosed invention. As a result, the invention is not to be limited by the foregoing embodiments, but only by the following claims.

We claim:

1. A method of placing clock circuits in an integrated circuit, the method comprising:
   receiving a circuit design to be implemented in the integrated circuit;
   establishing types of groups of components comprising clock circuits;
   identifying groups of components of the circuit design comprising clock circuits, each group of components generating a different clock signal of a plurality of clock signals;
   determining, based upon the types of groups, an order of the groups of components of the circuit design comprising clock circuits to be placed to improve run time for the placement of the circuit design;
   placing, using a computer, the groups of components of the circuit design comprising clock circuits in sites of the integrated circuit according to placement restrictions;
   wherein groups of components with locked components are placed before other groups of components, and the other groups of components are placed according to numbers of components of the other groups of components; and
   wherein, for each group of components comprising clock circuits being placed, it is determined, for each component of a group of components, whether the component matches a type of component at a site according to a first placement restriction, and whether a clock placement rule requires a placement of the component relative to another component of the group of components according to a second placement restriction.

2. The method of claim 1 wherein determining an order of the groups of components of the circuit design comprising clock circuits to be placed comprises identifying a group of components of a type of group having a component which is locked to a predetermined site.

3. The method of claim 1 wherein determining an order of the groups of components of the circuit design comprising clock circuits to be placed comprises identifying types of groups based upon numbers of components.

4. The method of claim 1 wherein placing the groups of components of the circuit design comprises implementing a branch and bound placement algorithm.

5. The method of claim 1 wherein placing the groups of components of the circuit design comprises selecting the locations of sites for implementing the components of the clock circuits of the circuit design.

6. The method of claim 5 further comprising determining whether the placement restrictions have been met after placing the groups of components of the circuit design.

7. The method of claim 1 further comprising placing a remaining portion of the circuit design.

8. A computer program product comprising:
   a non-transitory computer-readable medium having computer-readable program code that, when executed by a computer, places clock circuits of a circuit design in sites of the integrated circuit, the non-transient computer-readable medium comprising:
      computer-readable program code that receives a circuit design to be implemented in the integrated circuit;
      computer-readable program code that establishes types of groups of components comprising clock circuits;
      computer-readable program code that identifies groups of components of the circuit design comprising clock circuits, each group of components generating a different clock signal of a plurality of clock signals;

computer-readable program code that determines, based upon the types of groups, an order of the groups of components of the circuit design comprising clock circuits to be placed to improve run time for placement; and computer-readable program code that places the groups of components of the circuit design comprising clock circuits in sites of the integrated circuit according to placement restrictions, wherein groups of components with locked components are placed before other groups of components, and the other groups of components are placed according to numbers of components of the other groups of components; and wherein, for each group of components comprising clock circuits being placed, it is determined, for each component of a group of components, whether the component matches a type of component at a site according to a first placement restriction, and whether a clock placement rule requires a placement of the component relative to another component of the group of components according to a second placement restriction.

9. The computer program product of claim 8 wherein the computer-readable program code that determines an order of the group of components of the circuit design comprising clock circuits to be placed comprises computer-readable program code that identifies a group of components of a type of group having a component which is locked to a predetermined site.

10. The computer program product of claim 8 wherein the computer-readable program code that determines an order of the group of components of the circuit design comprising clock circuits to be placed comprises computer-readable program code that identifies types of groups based upon numbers of components.

11. The computer program product of claim 8 wherein the computer-readable program code that places the groups of components of the circuit design comprises computer-readable program code that implements a branch and bound placement algorithm.

12. The computer program product of claim 8 wherein the computer-readable program code that places the groups of components of the circuit design comprises computer-readable program code that selects the locations of sites for implementing the components of the clock circuits of the circuit design.

13. The computer program product of claim 12 further comprising computer-readable program code that determines whether the placement restrictions have been met after placing the groups of components of the circuit design.

14. The computer program product of claim 8 further comprising computer-readable program code that places a remaining portion of the circuit design.

15. A system for placing clock circuits in an integrated circuit, the system comprising:
   an input data that includes a circuit design to be implemented in the integrated circuit;
   a control circuit coupled to receive the input data, the control circuit placing clock circuits of the circuit design in sites of the integrated circuit, wherein the control circuit identifies groups of components of the circuit design comprising clock circuits based upon predetermined types of groups of components and determines an order of the groups of components of the circuit design to be placed, wherein the order is based upon the types of groups of components to improve run time for determining the placement information according to placement restrictions, wherein groups of components with locked components are placed before other groups of components, and the other groups of components are placed according to numbers of the other groups of components; and wherein, for each group of components comprising clock circuits being placed, it is determined, for each component of a group of components, whether the component matches a type of component at a site according to a first placement restriction, and whether a clock placement rule requires a placement of the component relative to another component of the group of components according to a second placement restriction; and
   a placement information, output by the control circuit, to provide information regarding a placement of the clock circuits.

16. The system of claim 15 wherein the control circuit determines an order of the groups of components to be placed by identifying a group of components of a type of group having a component which is locked to a predetermined site.

17. The system of claim 15 wherein the control circuit determines an order of the groups of components to be placed by determining types of groups based upon numbers of components.

18. The system of claim 15 wherein the control circuit places the groups of components of the circuit design by selecting the locations of sites for implementing the components of the clock circuits of the circuit design.

19. The system of claim 15 wherein the control circuit determines whether a placement restriction has been met after placing a component of the clock circuits.

20. The system of claim 15 wherein the control circuit places a remaining portion of the circuit design.

* * * * *